(12) United States Patent
Bae et al.

(10) Patent No.: US 7,427,530 B2
(45) Date of Patent: Sep. 23, 2008

(54) METHOD OF MANUFACTURING PHOTO DIODES HAVING A CONDUCTIVE PLUG CONTACT TO A BURIED LAYER

(75) Inventors: Sung-ryoul Bae, Gyeonggi-do (KR); Dong-kyun Nam, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 80 days.

(21) Appl. No.: 10/953,438

(22) Filed: Sep. 29, 2004

(65) Prior Publication Data

US 2005/0101073 A1 May 12, 2005

(30) Foreign Application Priority Data

Nov. 12, 2003 (KR) .................. 10-2003-0079903

(51) Int. Cl.
*H01L 21/00* (2006.01)

(52) U.S. Cl. .................. 438/98; 438/73; 257/E27.133; 257/466

(58) Field of Classification Search .................. 438/98, 438/91, 92, 72, 73, 57; 257/458, 438, 292, 257/233, 448, 443, 463–466, E27.133
See application file for complete search history.

(56) References Cited

U.S. PATENT DOCUMENTS

| | | | | |
|---|---|---|---|---|
| 5,886,374 | A | * | 3/1999 | Sakamoto et al. ............ 257/292 |
| 5,973,257 | A | * | 10/1999 | Cantarini et al. ............ 136/249 |
| 6,133,615 | A | * | 10/2000 | Guckel et al. ................ 257/446 |
| 6,218,719 | B1 | * | 4/2001 | Tsang ......................... 257/461 |
| 6,534,759 | B1 | * | 3/2003 | Koscielniak et al. ...... 250/214.1 |
| 6,538,294 | B1 | * | 3/2003 | Sjodin et al. ................ 257/409 |
| 6,828,644 | B2 | * | 12/2004 | Asano et al. ................ 257/461 |
| 6,930,336 | B1 | * | 8/2005 | Merrill ....................... 257/292 |
| 2001/0010943 | A1 | * | 8/2001 | Tsang ......................... 438/69 |
| 2001/0042875 | A1 | * | 11/2001 | Yoshida ...................... 257/291 |

(Continued)

FOREIGN PATENT DOCUMENTS

CN 1447445 10/2003

(Continued)

OTHER PUBLICATIONS

Notice to Submit a Response for Korean patent application No. 10-2003-0079903 mailed on Aug. 17, 2006.

(Continued)

*Primary Examiner*—Bradley W. Baumeister
*Assistant Examiner*—Steven J Fulk
(74) *Attorney, Agent, or Firm*—Myers Bigel Sibley & Sajovec

(57) ABSTRACT

Methods of manufacturing a photo diode include sequentially forming a buried layer of a first conductivity type, a first epitaxial layer of the first conductivity type, and a second epitaxial layer of a second conductivity type on a substrate. The second and first epitaxial layers are etched to form a trench that exposes a portion of the buried layer. A conductive plug of the first conductivity type is formed in the trench. A first electrode is formed on an upper surface of the second epitaxial layer. A second electrode may be formed to contact an upper surface of the conductive plug. Photodiodes having a conductive plug contact to a buried layer are also provided.

16 Claims, 5 Drawing Sheets

U.S. PATENT DOCUMENTS

2002/0070417 A1* 6/2002 Kimura et al. .............. 257/461

FOREIGN PATENT DOCUMENTS

| JP | 61-133660 | 6/1986 |
| JP | 2000106453 | 4/2000 |
| KR | 2001-0111028 | 12/2001 |
| KR | 2002-0048342 | 6/2002 |
| KR | 2002-92415 | 12/2002 |

OTHER PUBLICATIONS

Copy of Chinese Office Action, including translation, Application No. 2004100104204, dated Mar. 21, 2008.

* cited by examiner

METHOD OF MANUFACTURING PHOTO DIODES HAVING A CONDUCTIVE PLUG CONTACT TO A BURIED LAYER

CLAIM OF PRIORITY

This application is related to and claims priority from Korean Patent Application No. 2003-79903, filed on Nov. 12, 2003, in the Korean Intellectual Property Office, the disclosure of which is incorporated herein in its entirety by reference.

FIELD OF THE INVENTION

The present invention relates to photo diodes (PD) for converting incident light into an electric signal, and more particularly, to structures for reducing the series resistance of PDs and methods of manufacturing the same.

BACKGROUND OF THE INVENTION

PDs are generally used as optical elements in a semiconductor device to convert incident light into an electric signal (current or voltage). Such a PD is typically have either a PN junction structure, an avalanche breakdown (APD) structure or a PIN or NIP structure. PDs with a PIN structure typically include a P type electrode, an intrinsic epitaxial layer, an $N^+$ layer, and a P type substrate. PDs with an NIP structure typically include an N type electrode, an intrinsic epitaxial layer, a $P^+$ layer, and a P type substrate. Currently, PDs are typically manufactured using the NIP or PIN structures.

For example, PDs having an NIP or PIN structure may be used in an optical pickup to record data and/or reproduce data from a CD-ROM, a CD-R/RW, a DVD-ROM, a DVD-R/RW, or the like. PDs may also serve as an interface to transmit a signal to a servo.

FIG. 1 shows a conventional PD having an NIP structure. The PD of FIG. 1 is generally manufactured as follows. A $P^+$ buried layer 2 is formed on a P type substrate 1, and then a $P^-$ epitaxial layer 3 is formed on the $P^+$ buried layer 2. First $P^+$ separation diffusion layers 4 are formed. An N type epitaxial layer 7 is formed, and second $P^+$ separation diffusion layers 8 are formed to overlap the first $P^+$ separation diffusion layers 4. Here, ion implantation and thermal diffusion are performed to form the first and second $P^+$ separation diffusion layers 4 and 8. $N^+$ layers 13 are formed to reduce the resistance of the cathodes. A $P^+$ layer 8' is formed to form split PDs, and cathode contacts 14 and anode contacts 15 are formed.

The performance of a PD may be measured through light efficiency and a frequency characteristic. Research and development are in progress to improve such a performance. However, limiting factors of ion implantation and thermal diffusion performed in manufacturing the PD may make it difficult to further improve the performance of the PD.

As an example, minimizing series resistance of the PD may improve the performance and frequency characteristic of the PD. In FIG. 1, series resistance between the $P^+$ buried layer 2 and the first and second $P^+$ separation diffusion layers 4 and 8 may be the dominant components of the series resistance of the PD. Conventionally, a deep or shallow junction is formed to reduce such series resistance. However, reductions in the series resistance using ion implantation and thermal diffusion may have reached their limit and thus the ability to improve performance by reducing series resistance may be limited in devices using ion implantation and thermal diffusion.

For example, a thermal diffusion process must typically be sufficient to diffuse a high dose of impurities into a lower portion of a PD. However, such a thermal diffusion process may also result in the area of the PD increasing in a horizontal direction. Also, it may be difficult to implant a high dose of ions at a high energy to provide the high dose of impurities in the lower portion of the PD. Thus, horizontal diffusion of the ions may be unavoidable. As a result, the area of the PD may increase.

SUMMARY OF THE INVENTION

Some embodiments of the present invention provide methods of manufacturing a photo diode that include sequentially forming a buried layer of a first conductivity type, a first epitaxial layer of the first conductivity type, and a second epitaxial layer of a second conductivity type on a substrate. The second and first epitaxial layers are etched to form a trench that exposes a portion of the buried layer. A conductive plug of the first conductivity type is formed in the trench. A first electrode is formed on an upper surface of the second epitaxial layer and a second electrode may be formed to contact an upper surface of the conductive plug.

Further embodiments of the present invention include forming a thermal oxide layer on inner walls of the trench and removing the thermal oxide layer prior to forming the conductive plug.

In additional embodiments of the present invention, the formation of the conductive plug includes forming a conductive layer to fill the trench and etching back the conductive layer to expose the second epitaxial layer. In some embodiments of the present invention, the conductive layer includes Boro-Silicate-Glass, Phospho-Silicate-Glass or doped polysilicon. The dopant density of the conductive layer may be from about 1E20 to about 1E21 ions/cm$^3$.

In still further embodiments of the present invention, the formation of the first electrode includes implanting dopants of the second conductivity type in a region of the second epitaxial layer to provide a region of higher dopant concentration in the second epitaxial layer and forming the first electrode on the region of second epitaxial layer.

In some embodiments of the present invention, etching the second and first epitaxial layers to form a trench that exposes a portion of the buried layer includes etching the second and first epitaxial layer to form trenches that expose corresponding portions of the buried layer, forming a conductive plug of the first conductivity type in the trench includes forming conductive plugs of the first conductivity type in the trenches, forming a second electrode so as to contact an upper surface of the conductive plug includes forming second electrodes so as to contact an upper surface of corresponding ones of the conductive plugs, forming a first electrode on an upper surface of the second epitaxial layer includes forming first electrodes on the upper surface of the second epitaxial layer, implanting dopants of the second conductivity type in a region of the second epitaxial layer to provide a region of higher dopant concentration in the second epitaxial layer includes implanting dopants of the second conductivity type in regions of the second epitaxial layer to provide regions of higher dopant concentration in the second epitaxial layer and forming the first electrode on the region of second epitaxial layer includes forming first electrodes on corresponding ones of the regions. Such embodiments may also include implanting dopants of the first conductivity type in the second epitaxial layer to provide a region of the first conductivity type disposed between the regions of the second conductivity type.

Further embodiments of the present invention include forming a capping layer on the second epitaxial layer and the upper surface of the conductive plug. In such embodiments, the first and second electrodes penetrate through the capping layer.

Additional embodiments of the present invention include forming an inter-metal dielectric on the first and second electrodes, forming a light-shielding layer on the inter-metal dielectric to define a photosensitive section, etching the inter-metal dielectric in the photosensitive section and forming a conformal anti-reflection coating layer in the photosensitive section.

In some embodiments of the present invention, the first conductivity type is P-type and the second conductivity type is N-type. In other embodiments of the present invention, the first conductivity type is N-type and the second conductivity type is P-type.

Still further embodiments of the present invention provide methods of manufacturing a photo diode that include sequentially forming a $P^+$ buried layer, a $P^-$ epitaxial layer, and an N type epitaxial layer on a P type substrate. The N type epitaxial layer and the $P^-$ epitaxial layer are etched to form trenches that expose portions of the $P^+$ buried layer. $P^+$ conductive plugs are formed in the trenches. $N^+$ implantation layers are formed in the N type epitaxial layer. A $P^+$ implantation layer is formed in the N type epitaxial layer and disposed between the $N^+$ implantation layers. Anodes are formed to contact upper surfaces of the $P^+$ conductive plugs and cathodes are formed to contact the $N^+$ implantation layers.

In certain embodiments of the present invention, the formation of the $P^+$ conductive plugs includes forming a $P^+$ conductive layer to fill the trenches and etching back the $P^+$ conductive layer to expose the N type epitaxial layer. The $P^+$ conductive layer may include Boro-Silicate-Glass or doped polysilicon.

Further embodiments of the present invention provide a photo diode that includes a buried layer of a first conductivity type on a substrate, a first layer of the first conductivity type on the buried layer and a second layer of a second conductivity type on the first layer. A conductive plug extends through the second and first layers and contacts the buried layer. A first electrode is provided on an upper surface of the second layer. A second electrode may be provided on an upper surface of the conductive plug. The conductive plug may include Boro-Silicate-Glass, Phospho-Silicate-Glass or doped polysilicon. A dopant density of the conductive plug may be from about 1E20 to about 1E21 ions/cm$^3$. The upper surface of the conductive plug may be flat.

Additional embodiments of the present invention include a region of higher concentration of dopants of the second conductivity type disposed between the first electrode and the second layer.

In some embodiments of the present invention, the conductive plug comprises a plurality of conducive plugs that extend through the second and first epitaxial layers and contact the buried layer, the first electrode comprises a plurality of first electrodes, the second electrode comprises a plurality of second electrodes and the region of higher concentration of dopants comprises a plurality of regions. In Such embodiments, the photo diode may include a region of the first conductivity type disposed in the second layer between regions of higher concentration of dopants of the second conductivity type.

Further embodiments of the present invention include an inter-metal dielectric that covers the first and second electrodes, a light-shielding layer on the inter-metal dielectric to define a photosensitive section and a conformal anti-reflection coating layer in the photosensitive section.

DETAILED DESCRIPTION OF THE INVENTION

Figure 1:
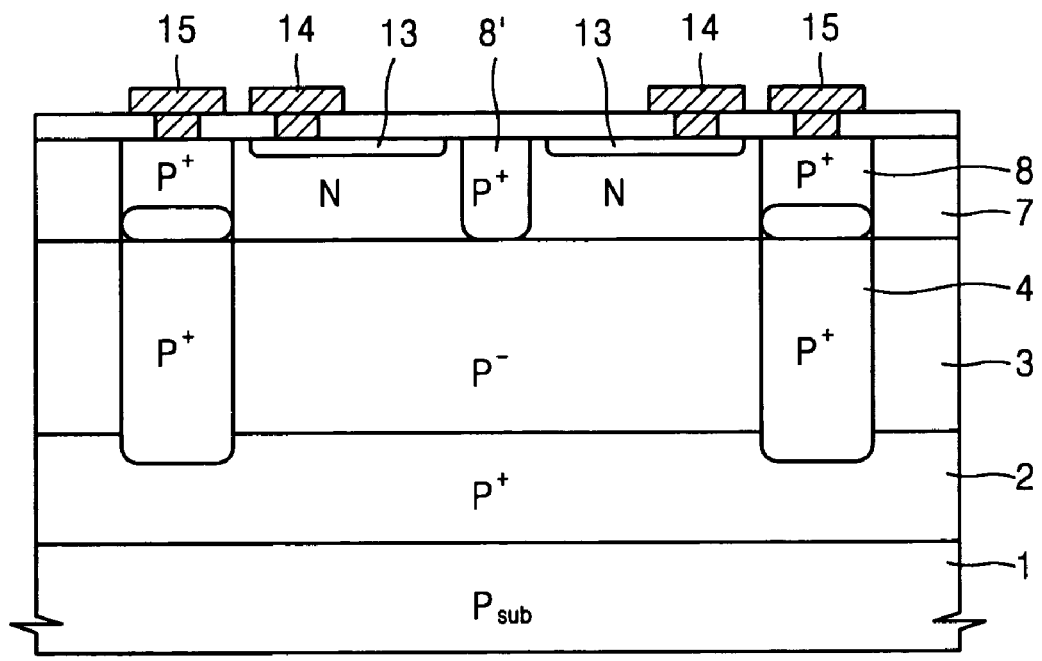
FIG. 1 is a cross-sectional view of a conventional PD having an NIP structure.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Hereinafter, methods of manufacturing PDs having an NIP structure, according to some embodiments of the present invention, will be described in detail with reference to the accompanying drawings. However, embodiments of the present invention should not be construed as limited to NIP structures but may also include PIN structures of opposite conductivity type. Furthermore, embodiments of the present invention are described with reference to common anode split type PDs. However, other PD structures may also benefit from the teachings of the present invention. Accordingly, embodiments of the present invention should not be construed as limited to the particular exemplary embodiments illustrated in the drawings. Furthermore, an integrated circuit for processing an electric signal output from a PD may be further integrated into a substrate including a PD according to embodiments of the present invention in order to manufacture an optical pickup.

Figure 2:
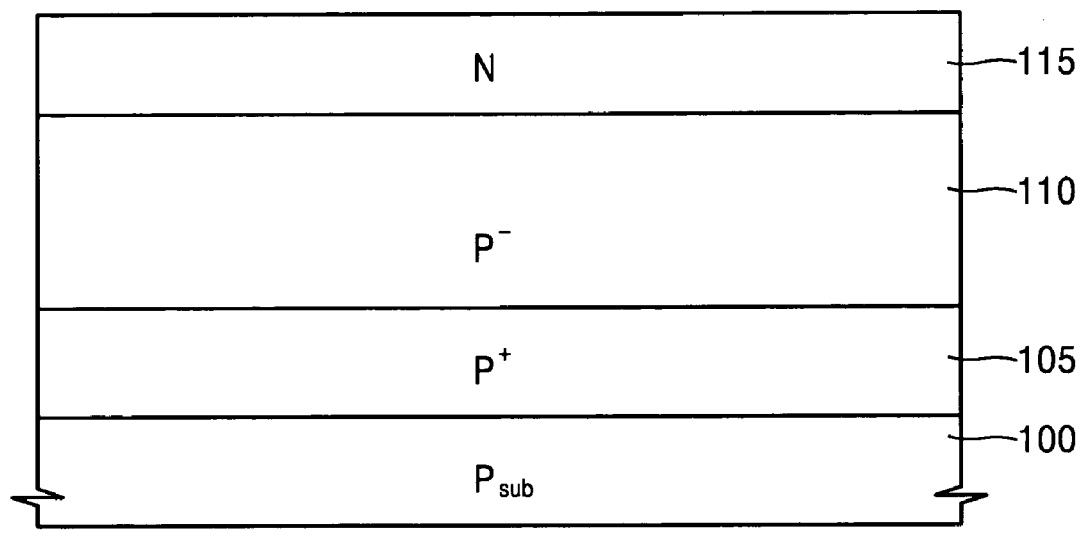
FIGS. 2 through 7 are cross-sectional views illustrating methods of manufacturing PDs according to some embodiments of the present invention.

FIGS. 2 through 7 are cross-sectional views illustrating methods of manufacturing PDs according to some embodiments of the present invention. As shown in FIG. 2, a P type substrate 100, such as a single crystal silicon substrate, is provided. A $P^+$ buried layer 105 is formed on the surface and, in some embodiments, an entire surface of the P type substrate 100. A $P^-$ first epitaxial layer 110 is formed on the $P^+$ buried layer 105. To form the $P^+$ buried layer 105, impurities, such as boron (B), are ion-implanted at a high density of 1E10 ions/cm$^3$, and then a thermal diffusion (drive-in) process is performed. The thickness and resistivity of the $P^-$ first epitaxial layer 110 may be major factors in providing a high performance PD. Thus, the thickness of the $P^-$ first epitaxial layer 110 is grown to about 8-12 μm and the resistivity of the $P^-$ first epitaxial layer 110 is about 100-200 Ω-cm. The $P^-$ first epitaxial layer 110 may be formed under conditions where out-diffusion caused by the $P^+$ buried layer 105 is minimized. An N type second epitaxial layer 115 is formed on the $P^-$ first epitaxial layer 110.

Figure 3:
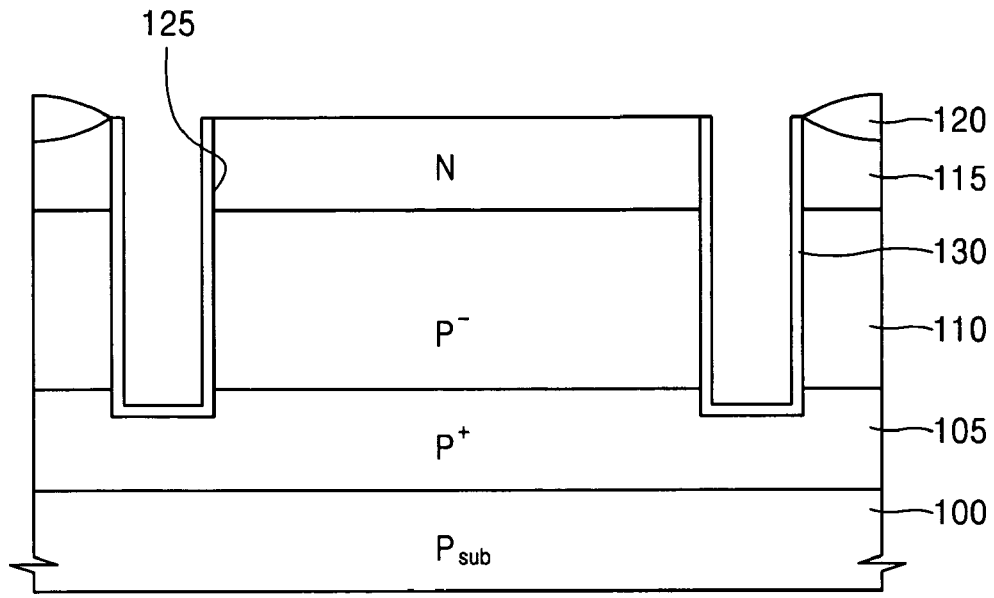

Referring to FIG. 3, isolation layers 120 are formed to define an active area. The isolation layers 120 may be formed using general LOCal Oxidation of Silicon (LOCOS) or Shallow Trench Isolation (STI). The N type second epitaxial layer 115 and the $P^-$ first epitaxial layer 110 are etched to form trenches 125 so as to expose the $P^+$ buried layer 105. The trenches 125 may be formed as follows. Thin pad oxide and nitride layers may be formed on the N type second epitaxial layer 115 and then patterned to form openings in portions of the pad oxide and nitride layers in which the trenches 125 are to be formed. Next, the N type second epitaxial layer 115 and the $P^-$ first epitaxial layer 110 are etched using the patterned pad oxide and nitride layers as a mask to form the trenches 125 to a depth of several through several tens of μm. In some embodiments of the present invention, the N type second epitaxial layer 115 and the $P^-$ first epitaxial layer 110 may be etched employing reactive ion etch (RIE) using $Cl_2$ and $SF_6$. Other etching techniques may also be used. Thereafter, the pad oxide and nitride layers are removed.

After the trenches 125 are completed, a thermal process may be performed under suitable conditions to release stress caused by etching. For example, the thermal process may be performed in a way of forming thermal oxide layers 130 on inner walls of the trenches 125 to the thickness of 50-200 Å. However, the thermal oxide layers 130 may not be formed.

Figure 4:
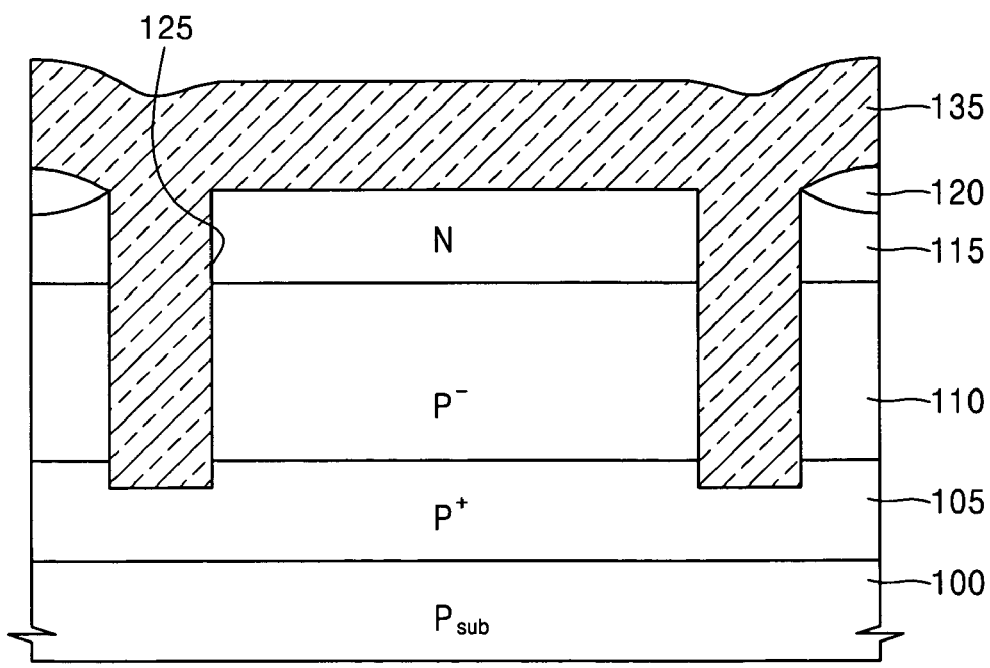

As shown in FIG. 4, after removal of the thermal oxide layers 130 (if present), a $P^+$ conductive layer 135 is formed to fill and, in some embodiments, fully fill the trenches 125. The $P^+$ conductive layer 135 may be formed of Boro-Silicate-Glass or $P^+$ doped polysilicon to reduce resistance of subsequently formed anodes. In some embodiments of the present invention, the dopant density of the $P^+$ conductive layer 135 is from about 1E20 to about 1E21 ions/cm$^3$. Doped polysilicon is deposited at a temperature of from about 500° C. to about 700° C. using Low Pressure Chemical Vapor Deposition (LPCVD). In some embodiments of the present invention, doped polysilicon may be formed to have a resistance of from several to several tens of Ω/□. In such a case, the doped polysilicon may contribute to a reduction in the series resistance to the buried P+ buried layer 105 in comparison to a corresponding implanted and diffused structure as described above. Polysilicon may be deposited and then doped with impurities using ion implantation. Also, polysilicon may be doped with impurities in-situ during deposition.

In embodiments of the present invention where a PD having a PIN structure is manufactured, the conductivity type of the buried layer is $N^+$. In such embodiments, an N type conductive layer, for example, Phospho-Silicate-Glass (PSG) or $N^+$ doped polysilicon, is used to extend to the $N^+$ buried layer to reduce resistance of cathodes of the device.

Figure 5:
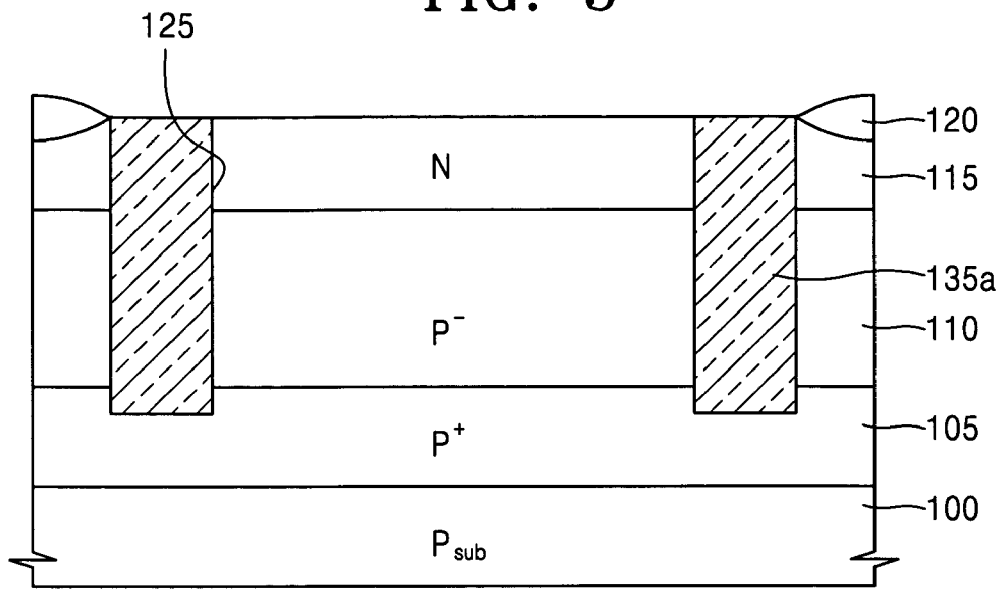

Referring to FIG. 5, the $P^+$ conductive layer 135 is etched back to expose the N type second epitaxial layer 115. As a result, conductive plugs 135a are formed in the trenches 125. The etch-back may be performed using a combination of HBr, $HeO_2$, $N_2$, and $CF_4$. In addition, a bias may be applied to the substrate 100 so as to increase the linearity of the gas. Since etch rates of the $P^+$ conductive layer 135 and the N type second epitaxial layer 115 are different, the N type second epitaxial layer 115 may be used as an etch stop layer. Alternatively, the pad oxide and nitride layers used for forming the trenches 125 as described with reference to FIG. 3 may be left on the structure and used as an etch stop layers. In this case, the pad oxide and nitride layers are removed after etch back of the P+ conductive layer 135 is performed.

Because the doping density of the P+ conductive layer 135 can be adjusted to reduce the resistance of the conductive plugs 135a, the series resistance between the conductive plugs 135a and the P+ buried layer 105 may be reduced. Thus, because the resistance of nodes contacting the conductive plugs 135a can be reduced in a subsequent process, the frequency characteristics and performance of the PD may be improved. Also, because a thermal diffusion process is not necessary, the PD is not greatly affected by heat and horizontal diffusion may be reduced or prevented.

Figure 6:
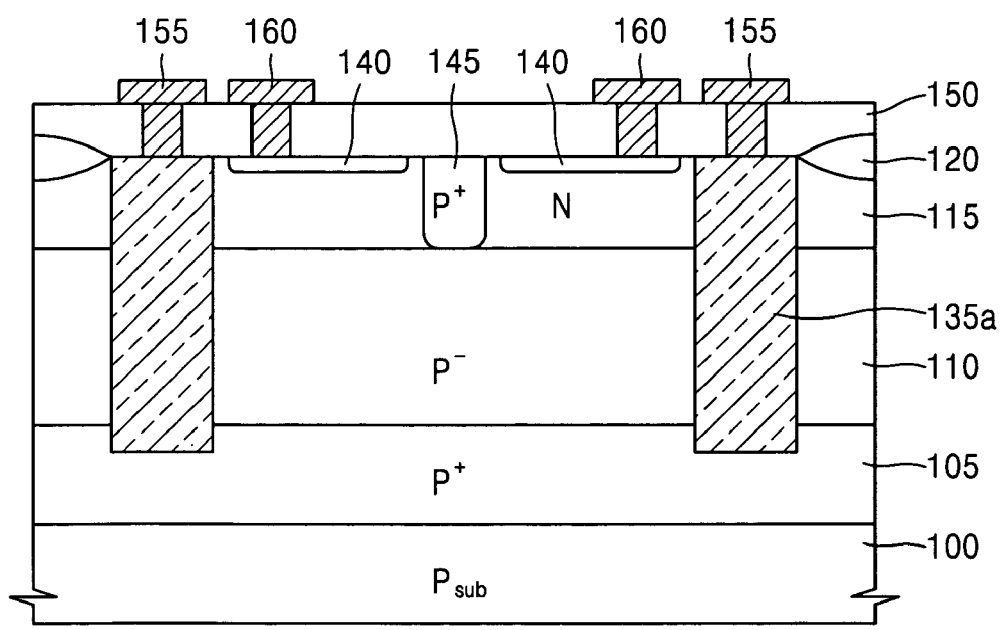

Referring to FIG. 6, N+ implantation layers 140 are formed in the N type second epitaxial layer 115 to reduce the resistance of cathodes. The N+ implantation layers 140 are shallow junctions to improve the performance of the PD. A P+ implantation layer 145 is formed to split the N+ implantation layers 140 so as to form split PDs. An interlayer dielectric (ILD) 150 is formed over the substrate 100. Anodes 155 are formed to contact upper surfaces of the conductive plugs 135a, and cathodes 160 are formed to contact the N+ implantation layers 140.

Figure 7:
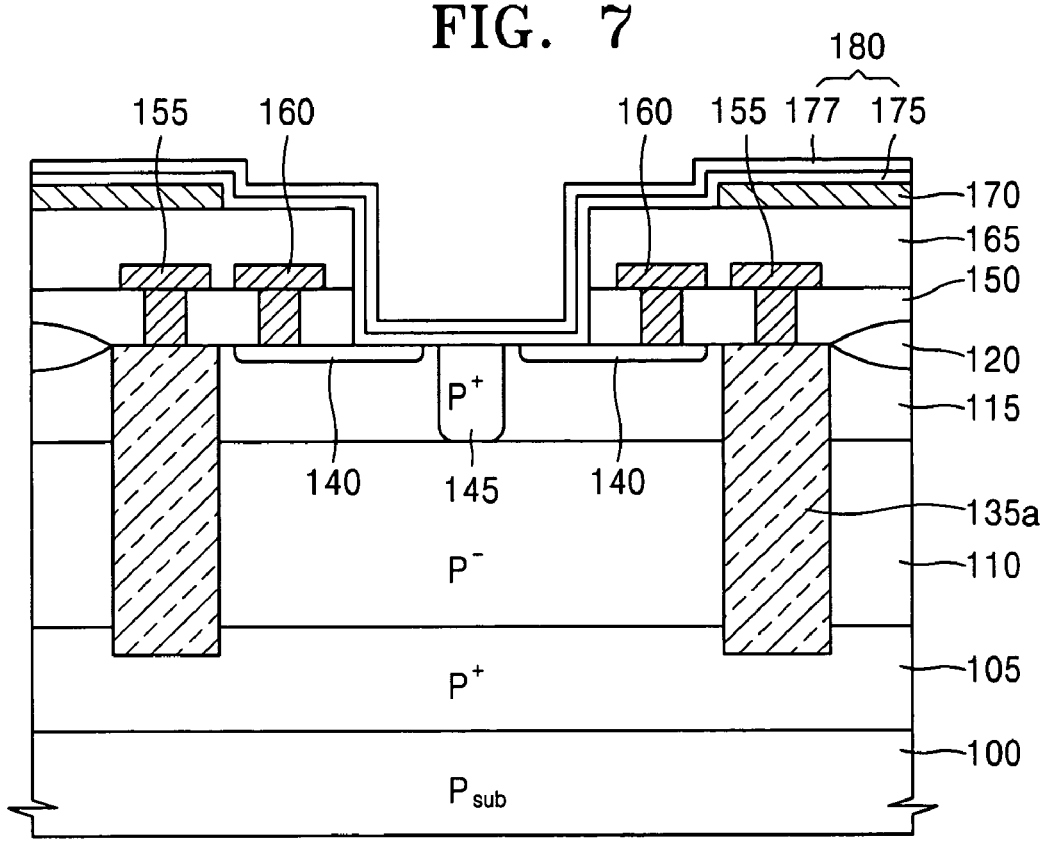

Thereafter, a light-shielding layer process and/or an antireflection coating (ARC) process may be performed. As shown in FIG. 7, an inter-metal dielectric (IMD) 165 is formed, and a light-shielding layer 170 is formed of a metal such as aluminum or the like to define a photosensitive section. The IMD 165 and the ILD 150 in the photosensitive section are etched, and a conformal ARC layer 180 is formed of a dual layer of a silicon oxide layer 175 and a silicon nitride layer 177. The silicon oxide layer 175 may be deposited by reacting $SiH_4$ and $O_2$ (or $N_2O$) using Plasma Enhanced Chemical Vapor Deposition (PECVD). The silicon nitride layer 177 may be deposited using $SiH_4$ and $NH_3$ as a source gas and Ar or He as a carrier gas and employing PECVD. The ARC process determines a PD's ability to absorb light, and preferably, determines materials and thickness of layers so as to maximize light absorption. The ARC layer 180 may be formed of amorphous carbon instead of the silicon oxide layer 175 and the silicon nitride layer 177. The structures of the IMD 165, the light-shielding layer 170, and the ARC layer 180 are exemplary and do not limit the scope of the present invention.

As described above, the PD of FIG. 7 includes a buried layer 105 of first conductivity type (P+), a first epitaxial layer 110 of first conductivity type (P−), and a second epitaxial layer 115 of second conductivity type (N type) which are sequentially formed on a substrate 100. Conductive plugs 135a penetrate through the second and first epitaxial layers 115 and 110 to contact the buried layer 105. First electrodes (anodes) 155 are formed on the conductive plugs 135a, and second electrodes (cathodes) 160 are formed on the second epitaxial layer 115. Here, the upper surfaces of the conductive plugs 135 are flat. High-density implantation layers of a second conductivity type, i.e., N+ implantation layers 140, are formed between the cathodes 160 and the second epitaxial layer 115. The N+ implantation layers 140 are split by a high-density implantation layer of first conductivity type, i.e., a P+ implantation layer 145. The anodes 155 and the cathodes 160 are covered with an IMD 165, and a light-shielding layer 170 may be formed on the IMD 165 to define a photosensitive section. A conformal ARC layer 180 may be further formed in the photosensitive section.

Instead of conventional separation diffusion layers that are formed using ion implantation and thermal diffusion to contact a buried layer, in some embodiments of the present invention, trenches are formed and filled with a conductive layer to form conductive plugs. Thus, the doping density of the conductive layer can be increased and a resistance of the conductive plugs can be reduced as compared to conventional structures using implantation and diffusion to contact the buried layer. As a result, the series resistance of anodes (in an NIP structure) or cathodes (in a PIN structure), conductive plugs, and a buried layer may be less than that of conventional implantation and diffusion devices, which may result in improving the frequency characteristic of the PD. Also, because ion implantation and thermal diffusion are not involved, junction areas can be decreased, which may be advantageous in achieving high integration of the PD. Accordingly, the performance of a semiconductor device may be maintained/improved while packing density of the semiconductor device can increase.

Figure 8:
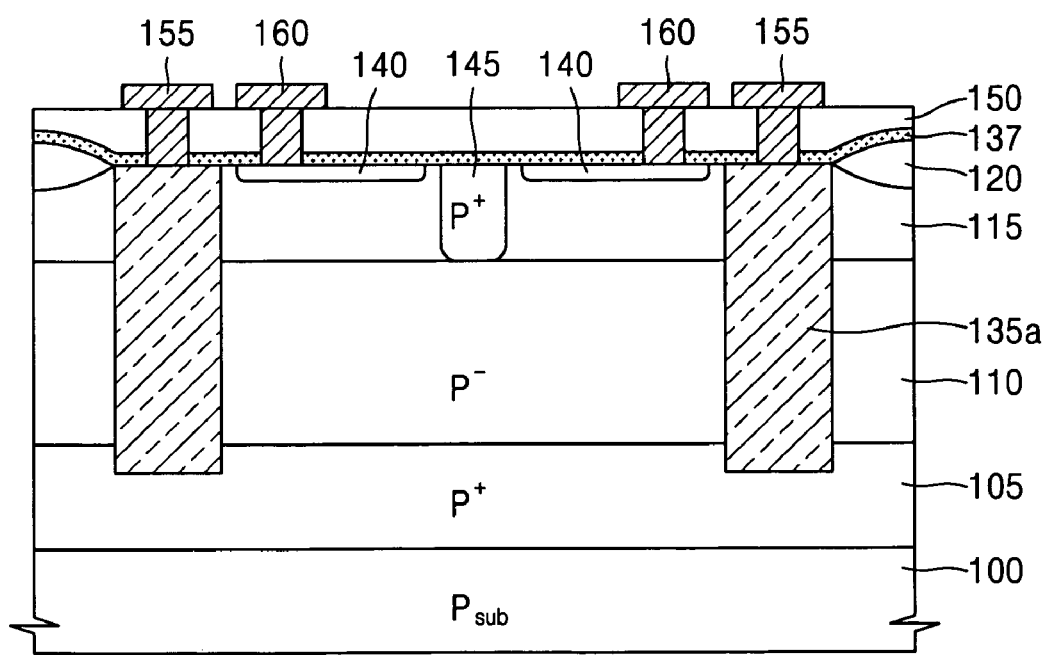
FIGS. 8 and 9 are cross-sectional views illustrating methods of manufacturing PDs according to further embodiments of the present invention.
Figure 9:
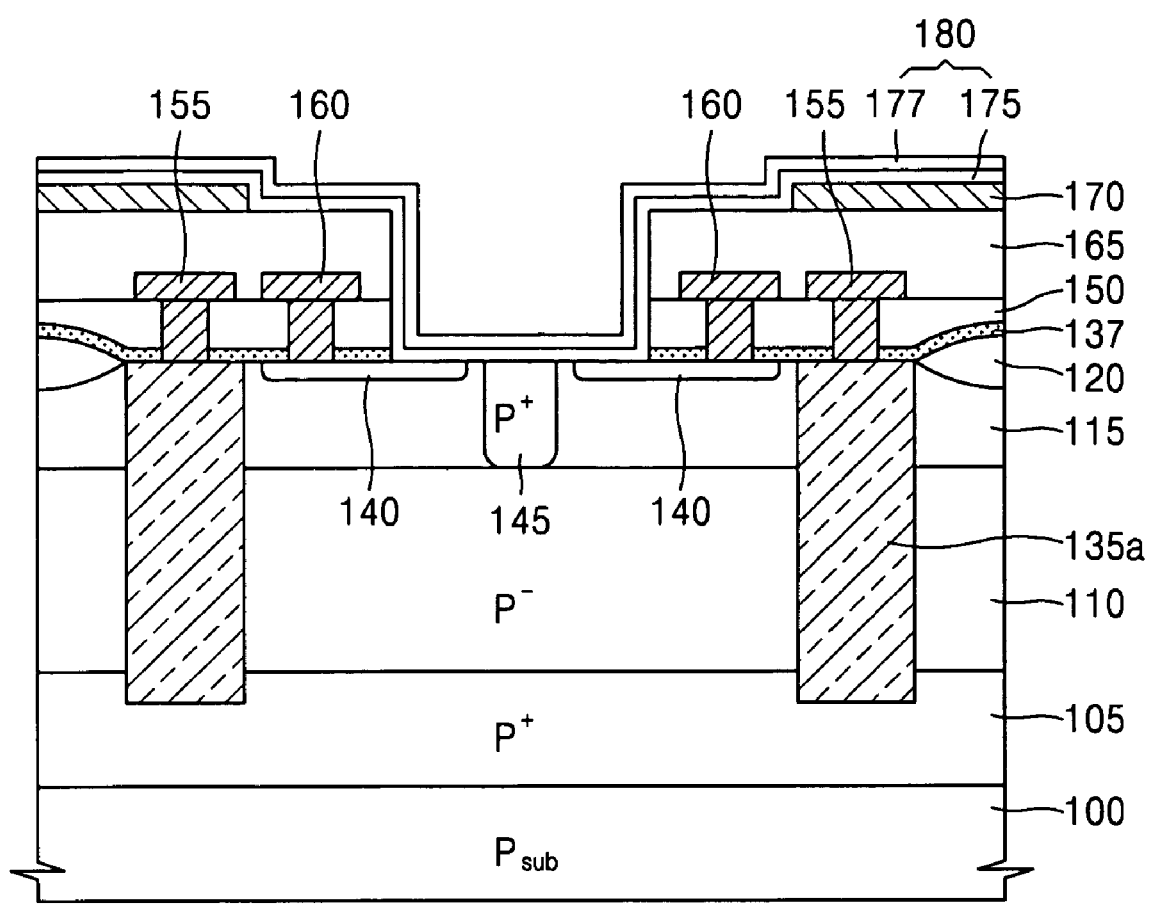

FIGS. 8 and 9 are cross-sectional views illustrating methods of manufacturing a PD according to further embodiments of the present invention.

Conductive plugs 135a are formed as described above with reference to FIGS. 1 through 5. A capping layer 137 is formed on the intermediate structure prior to formation of the ILD 150. If the conductive plugs 135a are formed of an oxide layer such as BSG, the oxide layer may be unintentionally removed in a subsequent process. Thus, the capping layer 137 is formed of a silicon nitride layer, and then opened in a contact process. The capping layer 137 of silicon nitride layer is etched using a fluorocarbon-based gas. In other words, a $C_xF_y$-based gas or a $C_aH_bF_c$-based gas may be used. For example, $CF_4$, $CHF_3$, $C_2F_6$, $C_4F_8$, $CH_2F_2$, $CH_3F$, $CH_4$, $C_2H_2$, $C_4F_6$, or a combination of $CF_4$, $CHF_3$, $C_2F_6$, $C_4F_8$, $CH_2F_2$, $CH_3F$, $CH_4$, $C_2H_2$, and $C_4F_6$ may be used. Thereafter, N+ implantation layers 140 and a P+ implantation layer 145 are formed. An ILD 150 is formed, and then anodes 155 and cathodes 160 are formed to penetrate through the capping layer 137.

Referring to FIG. 9, an IMD 165 is formed on the anodes 155 and the cathodes 160, and a light-shielding layer 170 is formed to define a photosensitive section. The IMD 165 and the ILD 150 in the photosensitive section are etched, and then an ARC layer 180 is formed of, for example, a dual layer of a silicon oxide layer 175 and a silicon nitride layer 177 as described above with reference to FIG. 7.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a photo diode, comprising:
    sequentially, on a substrate, forming a buried layer of a first conductivity type, a first epitaxial layer of the first conductivity type, and a second epitaxial layer of a second conductivity type;
    etching the second and first epitaxial layers to form a trench partially through the buried layer;
    forming a conductive plug of the first conductivity type in the trench, the conductive plug in contact with the first epitaxial layer and the second epitaxial layer; and
    forming a first electrode on an upper surface of the second epitaxial layer.

2. The method of claim 1, further comprising forming a second electrode so as to contact an upper surface of the conductive plug.

3. The method of claim 2, further comprising implanting dopants of the second conductivity type in a region of the second epitaxial layer to provide a region of higher dopant concentration in the second epitaxial layer, wherein:
etching the second and first epitaxial layers to form a trench partially through the buried layer comprises etching the second and first epitaxial layer to form trenches partially through the buried layer;
forming a conductive plug of the first conductivity type in the trench comprises forming conductive plugs of the first conductivity type in the trenches;
implanting dopants of the second conductivity type in a region of the second epitaxial layer to provide a region of higher dopant concentration in the second epitaxial layer comprises implanting dopants of the second conductivity type in regions of the second epitaxial layer to provide regions of higher dopant concentration in the second epitaxial layer;
forming a second electrode so as to contact an upper surface of the conductive plug comprises forming second electrodes so as to contact an upper surface of corresponding ones of the conductive plugs; and
forming a first electrode on an upper surface of the second epitaxial layer comprises forming first electrodes on corresponding ones of the regions.

4. The method of claim 3, further comprising implanting dopants of the first conductivity type in the second epitaxial layer to provide a region of the first conductivity type disposed between the regions of higher dopant concentration in the second epitaxial layer.

5. The method of claim 2, further comprising:
forming a capping layer on the second epitaxial layer and the upper surface of the conductive plug, wherein the first and second electrodes penetrate through the capping layer.

6. The method of claim 1, further comprising:
forming a thermal oxide layer on inner walls of the trench; and
removing the thermal oxide layer prior to forming the conductive plug.

7. The method of claim 1, wherein the formation of the conductive plug comprises:
forming a conductive layer to fill the trench; and
etching back the conductive layer to expose the second epitaxial layer.

8. The method of claim 7, wherein the conductive layer comprises Boro-Silicate-Glass, Phospho-Silicate-Glass or doped polysilicon.

9. The method of claim 7, wherein a dopant density of the conductive layer is from about 1E20 to about 1E21 ions/cm$_3$.

10. The method of claim 1, wherein forming the electrode comprises:
implanting dopants of the second conductivity type in a region of the second epitaxial layer to provide a region of higher dopant concentration in the second epitaxial layer; and
forming the first electrode on the region of the second epitaxial layer.

11. The method of claim 1, further comprising:
forming an inter-metal dielectric on the first and second electrodes;
forming a light-shielding layer on the inter-metal dielectric to define a photosensitive section;
etching the inter-metal dielectric in the photosensitive section; and
forming a conformal anti-reflection coating layer in the photosensitive section.

12. The method of claim 1, wherein the first conductivity type is P-type and the second conductivity type is N-type.

13. The method of claim 1, wherein the first conductivity type is N-type and the second conductivity type is P-type.

14. A method of manufacturing a photo diode, comprising:
sequentially, on a P type substrate, forming a P$^+$ buried layer, a P$^-$ epitaxial layer, and an N type epitaxial layer;
etching the N type epitaxial layer and the P$^-$ epitaxial layer to form trenches partially through the P$^+$ buried layer;
forming P$^+$ conductive plugs in the trenches, the P$^+$ conductive plugs in contact with the P$^-$ epitaxial layer and the N type epitaxial layer;
forming N$^+$ implantation layers in the N type epitaxial layer;
forming a P$^+$ implantation layer in the N type epitaxial layer and disposed between the N$^+$ implantation layers;
forming anodes so as to contact upper surfaces of the P$^+$+conductive plugs; and
forming cathodes so as to contact the N$^+$ implantation layers.

15. The method of claim 14, wherein the formation of the P$^+$ conductive plugs comprises:
forming a P$^+$ conductive layer to fill the trenches; and
etching back the P$^+$ conductive layer to expose the N type epitaxial layer.

16. The method of claim 15, wherein the P$^+$ conductive layer comprises Boro-Silicate-Glass or doped polysilicon.

* * * * *